(12) United States Patent  (10) Patent No.: US 8,772,628 B2
Wanlass et al.  (45) Date of Patent: Jul. 8, 2014

(54) HIGH PERFORMANCE, HIGH BANDGAP, LATTICE-MISMATCHED, GAINP SOLAR CELLS

(75) Inventors: Mark W. Wanlass, Golden, CO (US); Jeffrey J. Carapella, Golden, CO (US); Myles A. Steiner, Golden, CO (US)

(73) Assignee: Alliance for sustainable Energy, LLC, Golden, CO (US)

( * ) Notice: Subject to any disclaimer, the term of this patent is extended or adjusted under 35 U.S.C. 154(b) by 805 days.

(21) Appl. No.: 12/992,871

(22) PCT Filed: Jan. 29, 2009

(86) PCT No.: PCT/US2009/032480
§ 371 (c)(1),
(2), (4) Date: Feb. 7, 2011

(87) PCT Pub. No.: WO2009/139935
PCT Pub. Date: Nov. 19, 2009

(65) Prior Publication Data
US 2011/0186115 A1  Aug. 4, 2011

Related U.S. Application Data

(63) Continuation-in-part of application No. 12/121,463, filed on May 15, 2008, now Pat. No. 8,173,891, which is a continuation-in-part of application No. 11/027,156, filed on Dec. 30, 2004, now Pat. No. 8,067,687.

(51) Int. Cl.
*H01L 31/00* (2006.01)
*H01L 21/00* (2006.01)
*H01L 31/0687* (2012.01)

(52) U.S. Cl.
CPC ......... *H01L 31/06875* (2013.01); *Y02E 10/544* (2013.01)
USPC ............................................. 136/255; 438/57

(58) Field of Classification Search
CPC ........................ H01L 31/0725; H01L 31/0735
USPC ............................................. 136/255; 438/57
See application file for complete search history.

(56) References Cited

U.S. PATENT DOCUMENTS 3,900,868 A * 8/1975 Bock et al. ...................... 342/48
4,214,916 A   7/1980 Felsher et al.
4,255,211 A   3/1981 Fraas (Continued)

FOREIGN PATENT DOCUMENTS

JP  11-163380    6/1999
JP  2003-347582  12/2003

(Continued)

OTHER PUBLICATIONS

International Search Report for PCT/US2009/032480 dated Nov. 19, 2009.

(Continued)

*Primary Examiner* — Devina Pillay
(74) *Attorney, Agent, or Firm* — John C. Stolpa

(57) ABSTRACT

High performance, high bandgap, lattice-mismatched, photovoltaic cells (10), both transparent and non-transparent to sub-bandgap light, are provided as devices for use alone or in combination with other cells in split spectrum apparatus or other applications.

18 Claims, 10 Drawing Sheets

(56) References Cited

U.S. PATENT DOCUMENTS

| | | | |
|---|---|---|---|
| 4,278,474 | A | 7/1981 | Blakeslee et al. |
| 4,338,480 | A | 7/1982 | Antypas et al. |
| 4,881,979 | A | 11/1989 | Lewis |
| 4,963,508 | A | 10/1990 | Umeno et al. |
| 4,963,949 | A | 10/1990 | Wanlass et al. |
| 5,019,177 | A | 5/1991 | Wanlass |
| 5,053,083 | A | 10/1991 | Sinton |
| 5,185,288 | A | 2/1993 | Cook et al. |
| 5,261,969 | A | 11/1993 | Stanbery |
| 5,322,572 | A | 6/1994 | Wanlass |
| 5,376,185 | A | 12/1994 | Wanlass |
| 5,407,491 | A | 4/1995 | Freundlich et al. |
| 5,479,032 | A | 12/1995 | Forrest et al. |
| 5,571,339 | A | 11/1996 | Ringel et al. |
| 5,716,459 | A | 2/1998 | Chang et al. |
| 5,853,497 | A | 12/1998 | Lillington et al. |
| 5,865,906 | A | 2/1999 | Ferguson et al. |
| 5,944,913 | A | 8/1999 | Hou et al. |
| 6,034,321 | A | 3/2000 | Jenkins |
| 6,107,562 | A | 8/2000 | Hashimoto et al. |
| 6,150,604 | A | 11/2000 | Freundlich et al. |
| 6,162,768 | A | 12/2000 | Coolbaugh et al. |
| 6,162,987 | A | 12/2000 | Murray et al. |
| 6,180,432 | B1 | 1/2001 | Freeouf |
| 6,218,607 | B1 | 4/2001 | Mulligan et al. |
| 6,239,354 | B1 | 5/2001 | Wanlass |
| 6,252,287 | B1 | 6/2001 | Kurtz et al. |
| 6,255,580 | B1 | 7/2001 | Karam et al. |
| 6,265,653 | B1 | 7/2001 | Haigh et al. |
| 6,281,426 | B1 | 8/2001 | Olson et al. |
| 6,300,557 | B1 | 10/2001 | Wanlass |
| 6,300,558 | B1 | 10/2001 | Takamoto et al. |
| 6,316,715 | B1 | 11/2001 | King et al. |
| 6,340,788 | B1 | 1/2002 | King et al. |
| 6,420,732 | B1* | 7/2002 | Kung et al. ............ 257/79 |
| 6,482,672 | B1 | 11/2002 | Hoffman et al. |
| 6,660,928 | B1 | 12/2003 | Patton et al. |
| 6,680,432 | B2 | 1/2004 | Sharps et al. |
| 6,743,974 | B2* | 6/2004 | Wada et al. ............ 136/255 |
| 6,815,736 | B2 | 11/2004 | Mascarenhas |
| 6,917,061 | B2 | 7/2005 | Pan et al. |
| 6,951,819 | B2 | 10/2005 | Iles et al. |
| 7,095,050 | B2 | 8/2006 | Wanlass et al. |
| 7,309,832 | B2 | 12/2007 | Friedman et al. |
| 7,488,890 | B2* | 2/2009 | Takamoto et al. ............ 136/255 |
| 7,675,077 | B2* | 3/2010 | Shei et al. ............ 257/97 |
| 8,067,687 | B2 | 11/2011 | Wanlass |
| 8,173,891 | B2 | 5/2012 | Wanlass et al. |
| 2002/0062858 | A1 | 5/2002 | Mowles |
| 2003/0015700 | A1 | 1/2003 | Eisenbeiser et al. |
| 2003/0160251 | A1 | 8/2003 | Wanlass et al. |
| 2004/0166681 | A1* | 8/2004 | Iles et al. ............ 438/689 |
| 2004/0206389 | A1 | 10/2004 | Takamoto et al. |
| 2005/0274411 | A1 | 12/2005 | King et al. |
| 2006/0112986 | A1 | 6/2006 | Atwater, Jr. et al. |
| 2006/0144435 | A1 | 7/2006 | Wanlass |
| 2006/0162768 | A1 | 7/2006 | Wanlass et al. |
| 2006/0185582 | A1* | 8/2006 | Atwater et al. ............ 117/89 |
| 2007/0151595 | A1 | 7/2007 | Chiou et al. |
| 2007/0277869 | A1 | 12/2007 | Shan et al. |
| 2008/0149915 | A1* | 6/2008 | Mori et al. ............ 257/13 |
| 2008/0200020 | A1* | 8/2008 | Krull et al. ............ 438/592 |
| 2009/0078308 | A1* | 3/2009 | Varghese et al. ............ 136/255 |
| 2009/0229659 | A1 | 9/2009 | Wanlass et al. |
| 2009/0288703 | A1 | 11/2009 | Stan et al. |

FOREIGN PATENT DOCUMENTS

| | | |
|---|---|---|
| WO | 03/100868 | 12/2003 |
| WO | 2004/017425 | 2/2004 |
| WO | 2004/022820 | 3/2004 |

OTHER PUBLICATIONS

Written Opinion of the International Search Authority for PCT/US2009/032480 dated Nov. 15, 2010.

International Preliminary Report on Patentability for PCT/US2009/032480 dated Nov. 17, 2010.

Aiken, "Anti-reflection coating design for series interconnected multi-junction solar cells", Progress Photovoltaics: Research Applications, Nov./Dec. 2000, vol. 8, No. 6, pp. 563-570.

Aiken, "High performance anti-reflection coatings for broadband multi-junction solar cells," Solar Energy Materials & Solar Cells, Nov. 2000, vol. 64, No. 4, pp. 393-404.

Lamorte, et al., "Computer Modeling of a Two-junction, Monolithic Cascade Solar Cell," IEEE Transactions on Electron Devices, Jan. 1980, vol. 27, Issue 1, pp. 231-249.

Wanlass, et al., "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), Jun. 14-16, 2004, pp. 462-470.

Wanlass, et al., "Lattice-Mismatched Approaches for High Performance, III-V Photovoltaic Energy Converters", 31st IEEE Photovoltaics Specialists Conference and Exhibition, Feb. 2005, pp. 1-6.

Wehrer, et al, "0.74/0.55-eV Gaxln1-xAs/InAsyP1-y Monolithic, Tandem, MIM TPV Converters: Design, Growth, Processing and Performance," Proc. 29th IEEE Photovoltaic Spec. Conf., May 2002, pp. 884-887, New Orleans, LA.

Yablonovich, et al., "Extreme selectivity in the lift-off of epitaxial GaAs films", Applied Physics Letters, Dec. 28, 1987, vol. 51, No. 26, pp. 2222-2224.

Zahler, et al., "Wafer Bonding and Layer Transfer Processes for 4-Junction High Efficiency Solar Cells", Proceedings of the 29th IEEE Photovoltaic Specialists Conference, May 2002, pp. 1039-1042 New Orleans, LA.

International Search Report for International (PCT) Application No. PCT/US02/16101, mailed Sep. 6, 2002.

Written Opinion for International (PCT) Application No. PCT/US02/16101, mailed Apr. 6, 2004.

International Preliminary Examination Report for International (PCT) Application No. PCT/US02/16101, mailed Aug. 30, 2004.

Sinharoy et al., "Progress in the Development of Metamorphic Multi-junction III-V Space Solar Cells," Prog. Photovolt: Res. Appl., vol. 10, No. 6, Sep. 2002, pp. 427-432.

Venkatasubramanian et al., "An Inverted-Growth Approach to Development of an IR-Transparent, High-Efficiency AlGaAs/GaAs Cascade Solar Cell," Conf. Record of the 22nd IEEE Phtovoltaic Specialists Conference, Oct. 7-11, 1991, pp. 93-98.

Liu et al., "Electrochemical performance of $\alpha$-Fe2O3 nanorods as anode material for lithium-ion cells," Electrochimica Acta, vol. 54, Issue 6, Feb. 2009, pp. 1733-1736.

\* cited by examiner

HIGH PERFORMANCE, HIGH BANDGAP, LATTICE-MISMATCHED, GAINP SOLAR CELLS

CROSS-REFERENCE TO RELATED APPLICATIONS

This application is a continuation-in-part of U.S. patent application Ser. No. 12/121,463, filed May 15, 2008, which is a continuation-in-part of U.S. patent application Ser. No. 11/027,156, filed Dec. 30, 2004, each of which is incorporated herein by reference for all that is disclosed.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Sunlight is comprised of a broad range or band of solar radiation in a spectrum spanning short wavelength, high energy, ultra-violet light, through mid-wavelength, visible and near infra-red light, and extending into longer wavelength, lower energy infra-red light. Various semiconductor materials have small enough gaps, called bandgaps, between their valence and conduction energy bands that some level of solar radiation energy will cause electrons in their valence energy bands to transition or jump the bandgap from the valence band to the conduction band, where they can become part of the creation of an electric field and electric current when the semiconductor materials are processed and assembled in a manner that enables such solar energy to electric energy conversion. The size of the bandgap determines how much solar energy is necessary to cause the electrons to transition from the valence band to the conduction band, and semiconductor materials exist or can be made with bandgaps to absorb and convert solar energy from any part of the solar spectrum to electric energy. However, each semiconductor material with its bandgap only absorbs and converts solar energy to electric energy efficiently in a narrow photon energy range that includes and extends slightly higher than its bandgap energy. If the photon energy in the solar radiation is lower than the bandgap, it will not be absorbed and converted to electric energy in that semiconductor material, but will instead continue to be transmitted through the semiconductor material much as light is transmitted through glass. In other words, semiconductor materials are transparent to solar radiation or light with photon energy less than the bandgap energy, and, except for minor absorption losses that create heat, such lower energy solar radiation will pass through such semiconductor materials and not be converted to electric energy. On the other hand, if the photon energy in the solar radiation is very much higher than the bandgap energy of the semiconductor material, it will be absorbed and cause the electrons to jump the bandgap, thus convert some of such energy to electric energy, but the excess energy over the amount needed for the electrons to jump the bandgap will be thermalized and lost in heat dissipation instead of converted to electric energy. Consequently, for efficient conversion of solar energy from the entire solar radiation spectrum to electric energy, multiple bandgaps distributed throughout the solar spectrum may be needed.

The challenge to implement semiconductor photovoltaic converters with multiple bandgaps distributed throughout the broad solar spectrum has been addressed in a number of ways, including, for example, stacking a plurality of single bandgap photovoltaic converters one on top of another so that light with sub-bandgap energy, i.e., photon energy less than the bandgap of a higher bandgap photovoltaic converter, will pass through that converter to the next lower bandgap converter and, if not absorbed there, perhaps to one or more additional, even lower bandgap converters, until it either gets to a semiconductor material with a low enough bandgap that it will be absorbed and converted to electric energy or gets transmitted out of the system. Another approach has been to include a plurality of subcells with different bandgaps in monolithic, multi-bandgap, tandem, photovoltaic converter devices. Still another approach has been to split the solar spectrum into two or more energy bands and direct each band to a different semiconductor cell with an appropriate bandgap for the energy level of the band that is directed to it.

All of these and other approaches have their advantages and disadvantages. For example, the individual, single bandgap photovoltaic converter cells with different bandgaps stacked together is relatively simple, but reflectance of anti-reflection coatings to prevent reflection of the incident solar radiation is inconsistent and not highly efficient for all wavelengths of light in the solar spectrum, so it is difficult to prevent losses due to reflection at the front face of the top cell, and there are a lot of energy losses associated with, multiple surfaces and interfaces and with sub-bandgap absorption, and the like. Monolithic, multi-bandgap, tandem, photovoltaic converters eliminate some surfaces and interfaces, but they have similar front surface and anti-reflection coating issues, lattice matching and mismatching of semiconductor materials imposes constraints on semiconductor materials and bandgaps, and they are more difficult and expensive to make. Split spectrum schemes have the advantage of not having to deal with anti-reflection coatings for the entire solar spectrum, but disadvantages include more complexity with more parts, and more interfaces that generally result in more energy losses. The foregoing examples of the related art and limitations related therewith are intended to be illustrative and not exclusive. Other limitations of the related art will become apparent to those of skill in the art upon a reading of the specification and a study of the drawings.

SUMMARY

The following summary, embodiments, and aspects thereof are described and illustrated in conjunction with systems, tools, and methods which are meant to be examples and illustrative, not limiting or exclusive in scope. In various embodiments, one or more of the above-described problems have been reduced or eliminated, while other embodiments are directed to other improvements.

High performance photovoltaic converters for converting high energy solar radiation or radiation from other sources to electric energy are provided as stand-alone cell devices for use alone or in combination with other cells in a split spectrum apparatus or other applications. The example embodiments are directed to solar cells comprising group III-V semiconductor materials, for example, but not for limitation, GaInP alloys with bandgaps above 1.9 eV, which is about as high as group III-V alloys lattice-matched to GaAs or Ge substrates can be without resorting to the inclusion of some Al, although the methods and techniques can also be used for other devices and with other materials. In addition to these example aspects and embodiments described above and here-after, further aspects, embodiments and implementations will become apparent by reference to the drawings and by study and understanding of the following descriptions and explanations.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings.

DETAILED DESCRIPTION OF EXAMPLE EMBODIMENTS

Figure 1:
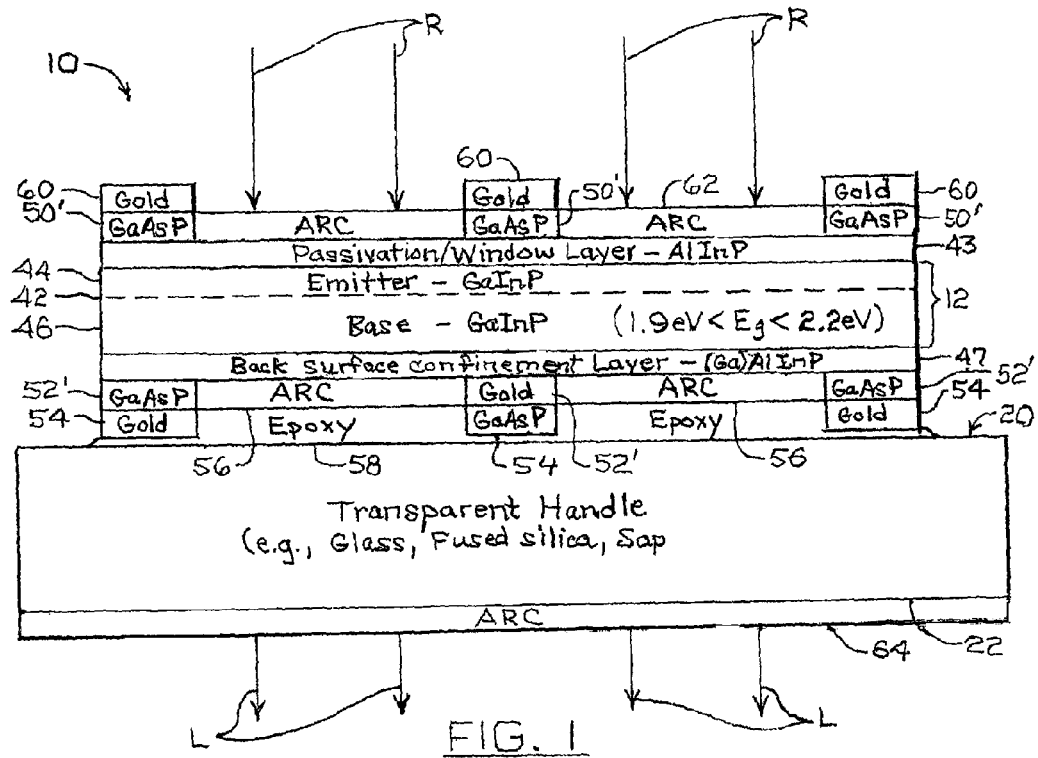
FIG. 1 is a diagrammatic illustration of an inverted, ultra-thin, transparent, high bandgap, group III-V, photovoltaic converter.

For an overview of several example features, process stages, and principles, an example high performance, high bandgap, lattice-mismatched, photovoltaic converter 10 is shown in FIG. 1. This photovoltaic converter 10 is shown as one example implementation that demonstrates a number of features, processes, and principles used to achieve a high performance solar cell with a bandgap in a range of about 1.9 to 2.2 eV for use in split spectrum applications or assemblies, but it also is useful for other applications and can be made in different variations. Therefore, this description will proceed with reference initially to the example shown in FIG. 1 and then to other examples and variations, but with the understanding that the claims below can also be implemented in myriad other ways, once the principles are understood from the descriptions, explanations, and drawings herein, and that some, but not all, of such other embodiments, implementations, and enhancements are also described or mentioned below.

In this description, the terms front and back in relation to orientation of the converter device and components of it refer to the direction that the light propagates through the device. Essentially, the incident light enters the cell on the front of the cell and propagates through the cell and related layers toward the back. Top is sometimes used interchangeably with front, and bottom is sometimes used interchangeably with back. The terms inverted or non-inverted refer to growth sequence or direction. The conventional practice of growing photovoltaic cells on substrates is and has been to grow the base portion, i.e., the back, of the cell first, and then growing the front (e.g., emitter portion) second, so that the back of the cell is set on the substrate and the front of the cell is over the base and exposed to the incident light. That conventional cell growth configuration, i.e., back or base first, followed by front or emitter second, is called non-inverted or upright. Cell configurations grown on a substrate in the opposite sequence or direction, i.e., front or emitter first, followed by back or base second, is called inverted. Cells that have their parent substrate removed are called ultra-thin cells. Also, the diagrams used or shown in the drawings are not drawn true to scale or in correct proportional relationships, because of the impracticality of illustrating nanometer sized, thin film layers and structures, but they are understandable by persons skilled in the art.

The example photovoltaic converter 10 shown in FIG. 1 is a transparent device suitable for use as a top cell in a system that includes multiple cells of lower bandgaps or as a high bandgap cell in a split spectrum solar collector assembly, although it can be used in other applications as well. In such multiple-cell systems or split spectrum solar collector assemblies, light that is transmitted through this top, or high bandgap cell is directed to one or more cells with lower bandgaps (not shown). In some applications or collector apparatus, such transmitted light may be spectrally split by custom-designed optics into several wavelength bands and directed to several different, lower bandgap cells (not shown). Therefore, this example photovoltaic converter 10 is made to be transparent to sub-bandgap light, i.e., light that is not absorbed and converted to electric energy in the cell 12. Essentially, incident solar radiation R (or it can be light from any other source) is transmitted by a top surface anti-reflection coating (ARC) 14 into the photovoltaic converter cell 12, where light that has photon energy equal to or greater than the bandgap energy $E_g$ is absorbed and converted to electric energy. The light with photon energy less than the bandgap energy $E_g$ (sometimes called the sub-bandgap light or the lower energy light L) is not absorbed by the cell 12 and is instead transmitted through the cell 12 and through the transparent handle 20 to emerge from the bottom surface 22 of the transparent handle 20, as indicated in FIG. 1. Since high solar or light energy to electric energy conversion efficiency is usually important, especially in solar cells in order for them to be economically feasible alternatives to other electric energy sources in commercial power generation applications or to keep the power generation to weight ratio high for portable power generation applications, a goal is to transmit as much of the sub-bandgap light, with as little energy loss due to absorption and other causes, as possible without sacrificing performance of the top cell 12.

Figure 10:
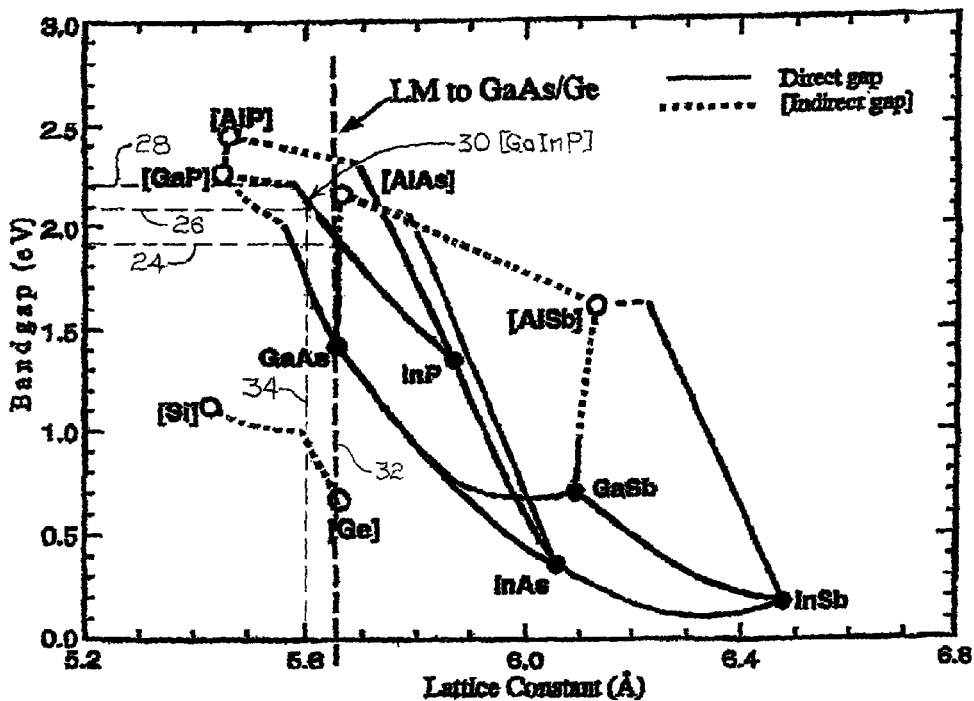
FIG. 10 is a graph showing bandgap (peak transition energy) versus lattice constant for group III-V semiconductor materials.

In this example photovoltaic converter 10, GaInP is used for the cell 12, because it can be formulated to have a direct bandgap in the range between about 1.9 eV to 2.2 eV, as indicated by the GaInP bandgap curve 30 in FIG. 10 between line 22 (about 1.9 eV) and line 28 (about 2.2 eV). It may be appropriate to mention here that materials with indirect bandgaps are not as efficient for energy conversion as materials with direct bandgaps, because, in addition to the electrons needing to absorb enough photon energy to jump the bandgap from the valence to the conduction band, they also need to undergo a change in momentum. Therefore, the transition is not as easy, and much thicker cells may be needed to absorb the energy, which not only add to cost, but also expose the sub-bandgap light to more free carrier absorption, thus loss of energy as heat, and shorter wavelength absorption may also suffer. Because the 2.2 eV bandgap (line 28 in FIG. 10) is very close to being an indirect bandgap, an appropriate design target for a high bandgap GaInP to convert shorter wavelength, higher energy light to electric energy may be a 2.1 eV bandgap, as indicated by the line 26 in FIG. 10. However, if it is desired to provide a cell with a bandgap 28 in 2.2+eV or even 2.3+eV ranges, a small amount of Al can be added to the GaInP to maintain the direct bandgap character.

One of the challenges in fabricating a 2.1 eV GaInP solar cell is that there is no readily available lattice-matched substrate on which to grow the crystalline GaInP cell. As shown by the line 32 in FIG. 10, GaAs substrate has a lattice constant of about 5.653 Å (Ge slightly larger at about 5.66 Å), whereas the relaxed lattice constant of 2.1 eV GaInP is about 5.597 Å as indicated by the line 34 in FIG. 10, which is approximately one percent smaller. Therefore, if GaAs is to be used as substrate on which to grow a cell of GaInP with a bandgap greater than 1.9 eV, the lattice mismatch has to be overcome by growing a graded layer in which the lattice constant in the growth plane is progressively reduced until it matches the target lattice constant of the particular GaInP alloy that will provide the desired bandgap above 1.9 eV—for example, the 5.597 Å relaxed lattice constant of 2.1 eV GaInP. It is appropriate to mention at this point that, because of certain atomic ordering and disordering tendencies affected by changing temperatures and/or growth rates, particular dopants used, and other process factors, there is not necessarily a unique correspondence between the bandgaps and the lattice constants of the materials that holds for all circumstances. Therefore, the graph in FIG. 10 is very useful, but persons skilled in the art recognize that any such representation can have slight variations from the particular lattice constant-bandgap bowing curves shown in FIG. 10. Therefore, the particular lattice constant and bandgap numbers used in this explanation are examples, but not limiting, as persons skilled in the art will understand.

Consequently, a method for fabricating the example GaInP cell shown in FIG. 1 includes, for example, but not for limitation, growing a graded layer 36 on a GaAs parent substrate 40 to transition from the lattice constant of the GaAs substrate to the lattice constant of the target GaInP needed for the cell 12. A Ge substrate may also be used, although the slightly larger lattice constant of Ge may need a little more grading to get to the lattice constant of the target GaInP. As can be seen on the graph in FIG. 10, a suitable material for the graded layer is the ternary alloy $GaAs_{1-x}P_x$, where the phosphorous (P) composition "x" increases from zero until the lattice constant is decreased to the lattice constant of the target GaInP. The increase in P can be gradually continuous, or it can be increased in steps, i.e., step graded. Step grading has been found to be better than a gradually continuous increase, because the discrete steps tend to not be as prone to carrying imperfections due to strain though the entire thickness of the graded layer. As can also be seen on the graph in FIG. 10, $Ga_xIn_{1-x}P$ with increasing Ga and correspondingly decreasing In, i.e., increasing "x", may also provide this graded lattice constant transition, but the $GaAs_{1-x}P_x$ has a benefit in a later selective etching step, as will be explained below. The problem with either $GaAs_{1-x}P_x$ or $Ga_xIn_{1-x}P$ as the grading layers 36 is that, over the range of compositions in the graded layer or layers 36, the bandgap of either material is entirely below the target bandgap of 1.9 eV to 2.2 eV. Therefore, the graded layers 36 absorbs a significant portion of the sub-bandgap light that is transmitted through the junction 42 of the cell 12, unless they are removed. Furthermore, the GaAs parent substrate 40 has a bandgap of 1.42 eV, which is well below the 1.9 to 2.2 eV of the GaInP cell 12, so it also absorbs a significant amount of the sub-bandgap light that is transmitted by the cell 12. Therefore, if the photovoltaic converter 10 is to be highly transparent to the sub-bandgap light transmitted by the cell 12, both the parent substrate 40 and the graded layers 36 have to be removed. In removing the parent substrate 40 and graded layers 36, however, a thin set of epilayers comprising the cell 12 is left. Therefore, to maintain support and structural integrity of the cell 12, the epilayers are bonded to the secondary substrate or handle 20, as will be explained in more detail below.

Figure 2:
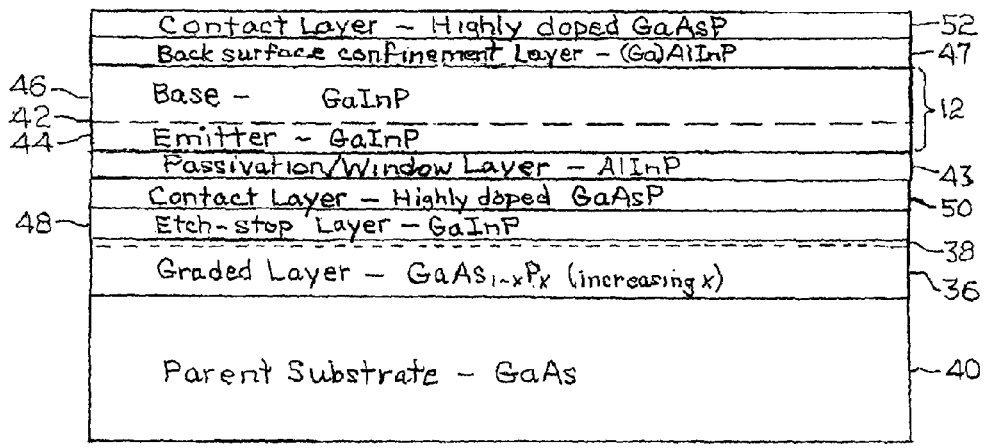
FIG. 2 is a diagrammatic illustration of a an early stage structure in a method of fabricating the photovoltaic converter in FIG. 1 through the epitaxial growth phase.

Referring now primarily to FIG. 2, the graded layers 36 are grown on the parent substrate 40 preferably, but not necessarily, in step grades, as explained above, with the top layer 38 (sometimes call a buffer layer) having a lattice constant in the growth plane that matches the relaxed lattice constant of the target GaInP cell 12. The lattice constant of the final GaAsP buffer layer 38 is determined by the target lattice constant of the desired GaInP cells 12, which is not necessarily a single variable problem. As explained above, the GaInP crystal lattice is prone to atomic ordering or disordering, which alters the bandgap of a particular lattice constant. Conversely, the same bandgap can be achieved with different lattice constants, depending on the ordering or disordering of the GaInP crystal. In general, therefore, to target GaInP with a bandgap in a range between 1.9 eV and 2.2 eV, the grading can be accomplished with 6 to 10 steps, each step being about 1.0 to 2.2 μm thick, with phosphorus content increased, and As content correspondingly decreased, by about 4 to 6 percent per step, and with the last step (buffer layer 38) being in a range of about 30 to 44 percent phosphorus. For a more specific example, but not for limitation, a $GaAs_{1-x}P_x$ step-graded layer 36 for a 2.1 eV target bandgap in a very ordered GaInP cell has been accomplished with a seven-step graded layer of $GaAs_{1-x}P_x$, each step being 2 μm thick, with phosphorus content increased by approximately six percent per step, and with the last step (buffer layer 38) being approximately 43 percent phosphorus. Under these conditions, a GaInP cell 12 was grown relaxed, with a composition of $Ga_{0.65}In_{0.35}P$. For more disordered GaInP material, which has a larger lattice constant than ordered GaInP material of the same bandgap, the final grade step, e.g., buffer layer 38, may only need to be about 32 percent phosphorous.

After the growth of the graded layers 36, an etch-stop layer 48 of the same lattice constant as the target GaInP cell 12 is grown on the buffer layer 38 of the graded layers 36, followed by a highly doped front contact layer 50 of GaAsP and a thin passivation/window layer 43 of AlInP doped with the same dopant type as will be used for the emitter 44 of the cell 12 (e.g., sulfur dopant for an n-type GaInP emitter), both of which are also formulated to have the same lattice constant as the target cell 12. As mentioned above, there are several etching steps in this process, and such etching can utilize the different chemical characteristics of GaInP and GaAsP to implement selective etching techniques to accomplish the fabrication of the photovoltaic converter device 10. Therefore, in this example, as mentioned above, $GaAs_{1-x}P_x$ is used for the graded layers 36, and GaInP is used for the etch-stop layer 48 to set the materials up for selective etching, as will be explained in more detail below.

A GaInP emitter 44 and GaInP base 46 with appropriate doping to form either a n/p or a p/n junction 42 are grown on the passivation/window layer 43 to form the cell 12. Persons skilled in the art know how to dope GaInP to form a cell, so it is not necessary to describe such doping materials, concentrations, and procedures in detail here. Suffice it to say that an example dopant for n-type GaInP material may be sulfur, and an example dopant for p-type GaInP material may be zinc. The emitter 44 is grown first, before the base 46, because, when the epitaxial structure is complete, it will be mounted on a handle 20 (FIG. 1), and the parent substrate 40 and graded layers 36 will be removed, as mentioned above, so that the cell 12 will be illuminated with incident light directed first to the emitter 44 and then to the base 46, as shown in FIG. 1. A back surface confinement layer 47 is grown on the GaInP base 46, and then a back contact layer 52 comprising heavily doped GaAsP is grown on the AlInP back surface confinement layer 47 to complete the epitaxial growth stage of the fabrication.

The passivation/window layer 43 and back surface confinement layer 47 together with the emitter 44 and base 46 form a double heterojunction cell, as is known by persons skilled in the art, so a detailed description of the materials and function of these layers is not necessary. Suffice it to say that the confinement layers are very thin, high bandgap layers, and, as an example, the back surface confinement layer may be AlInP, but more likely (Ga)InP, or, for n/p doped cells, it can be a very highly doped $p^+$-GaInP. For purposes of simplicity, the back surface confinement layer 47 is shown in the drawings as (Ga)AlInP, the parentheses indicating that Ga may be included as an option, but also with the understanding that $p^+$-GaInP is also feasible in this and other examples or embodiments.

Figure 3:
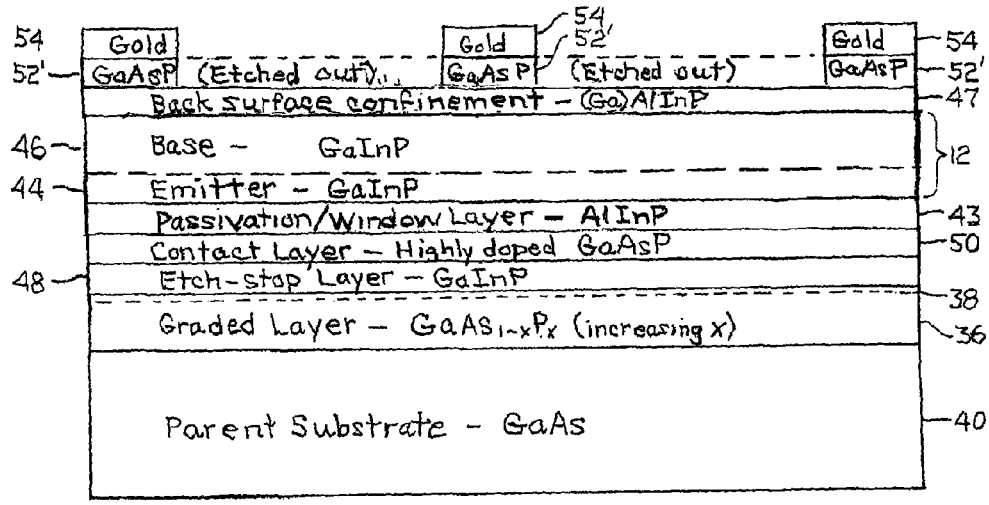
FIG. 3 is a diagrammatic illustration of an intermediate stage structure in the method of fabricating the photovoltaic converter in FIG. 1 through the application of a metal contact grid and removal of the back contact layer between the grid lines.
Figure 4:
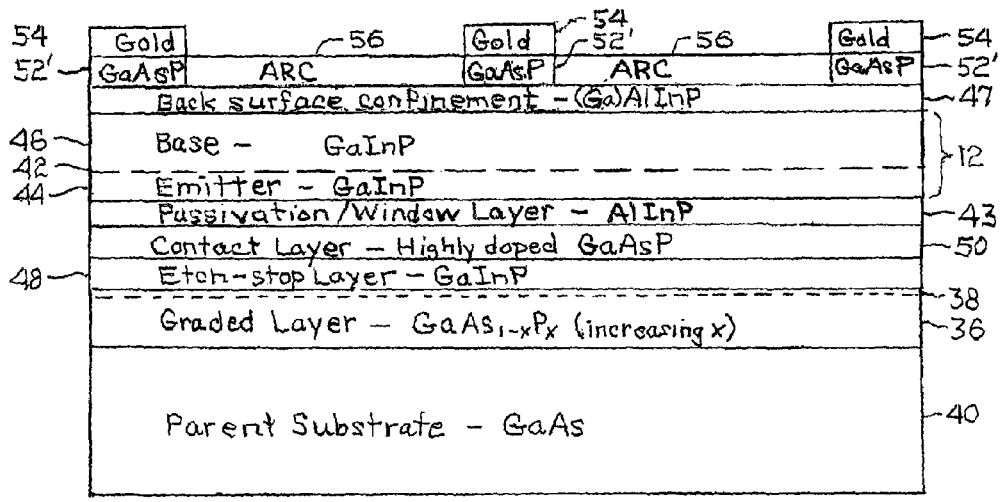
FIG. 4 is a diagrammatic illustration of another intermediate stage structure in the method of fabricating the photovoltaic converter in FIG. 1 through the application of a back anti-reflection coating.

After the epitaxial growth stage described above, a metal (preferably, but not necessarily, gold or the like) bottom or back grid 54 is electroplated to the back contact layer 52. The GaAsP back contact layer 52 is then etched away between the grids 54, for example, with phosphoric acid and hydrogen peroxide, as shown in FIG. 3, leaving strips or traces 52' of the GaAsP contact layer between the gold grid 54 and the base 46 of the cell to conduct current into the cell 12. A back anti-reflection coating (ARC) 56 can then be applied on the back surface confinement layer 47, as shown in FIG. 4. Persons skilled in the art are familiar with designing and applying anti-reflection coatings, so there is no need to describe the ARC 56 in more detail or how to make it here.

Figure 5:
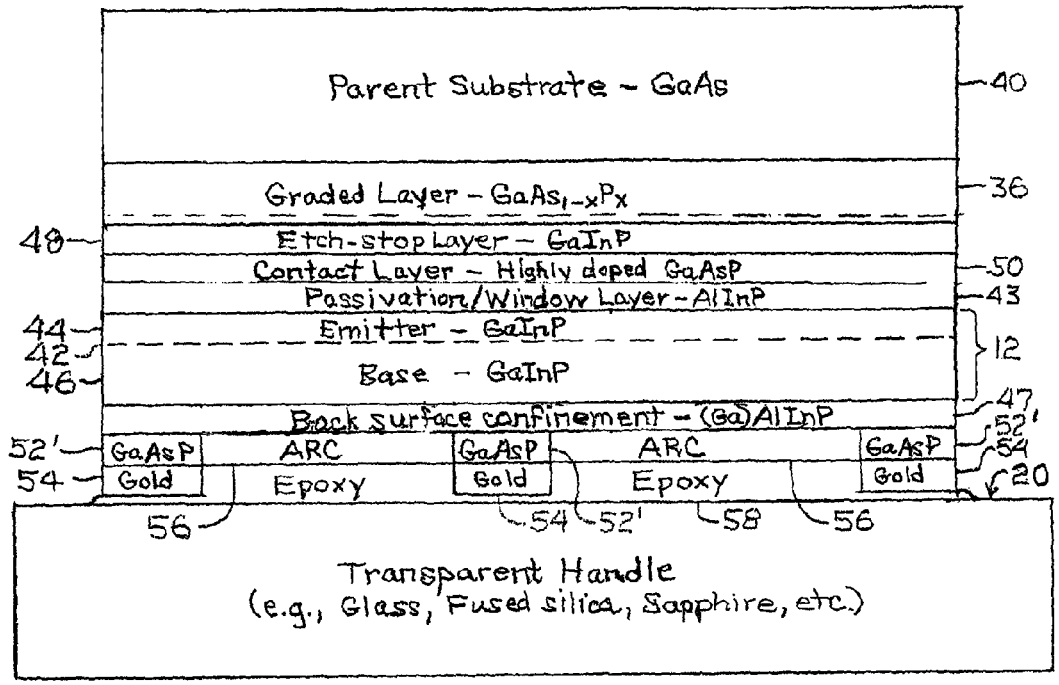
FIG. 5 is a diagrammatic illustration of another intermediate stage structure in the method of fabricating the photovoltaic converter in FIG. 1 through mounting the back of the structure on a transparent handle.

The back or epilayer side of the device is bonded to the transparent handle 20, as shown in FIG. 5. The structure is shown turned over in FIG. 5 for bonding to the handle 20, but it is not necessary to do so. The bonding is preferably, but not necessarily, done with a low-viscosity, transparent epoxy 58. The handle 20 can be any transparent material, for example, but not for limitation, glass, fused silica, or sapphire. It is beneficial to use a handle 20 and epoxy 58 that are transparent to sub-bandgap light. For example, if the cell 12 is formulated to have a bandgap of 2.1 eV, it will absorb the short light wavelengths of 590 nm and shorter and will transmit wavelengths longer than 590 nm. Therefore, in that example, it is beneficial to use a handle 20 and epoxy 58 that are transparent at least from about 590 nm to whatever is the longest wavelength that is absorbable and convertible to electric energy by the lowest bandgap cell, if any, in whatever assembly this high bandgap photovoltaic converter may be used (not shown).

Figure 6:
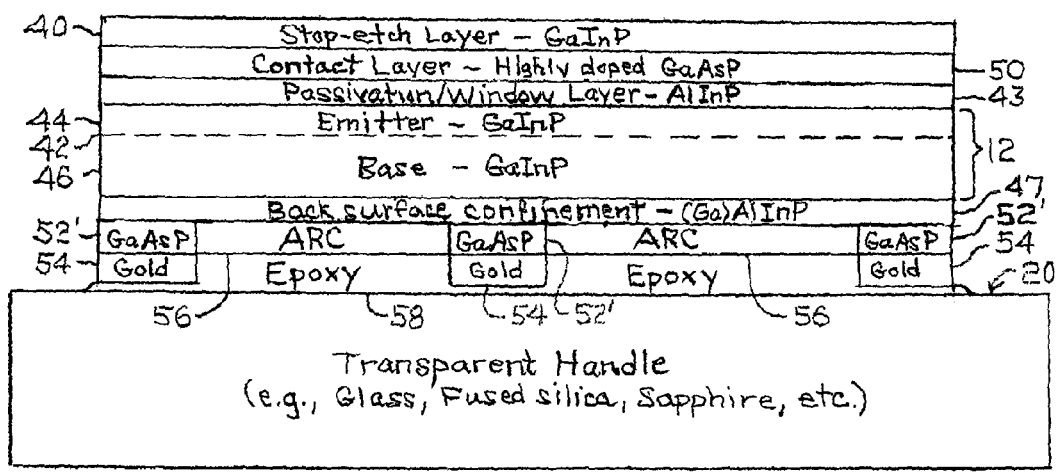
FIG. 6 is a diagrammatic illustration of another intermediate stage structure in the method of fabricating the photovoltaic converter in FIG. 1 through removal of the parent substrate and graded layers.

Once the structure is bonded to the transparent handle 20, as shown in FIG. 5, the parent substrate 40 and graded layers 36 are removed, as shown in FIG. 6. Such removal can be accomplished in a variety of ways, for example, but not for limitation, by wet chemical etching in a mixture of ammonium hydroxide and hydrogen peroxide. A 1:1 mixture of ammonium hydroxide and hydrogen peroxide has been shown to work for this purpose, and it has a high degree of selectivity for GaAsP, which was used for the graded layers 36, over the GaInP used for the etch-stop layer 48. Therefore, the etch stops abruptly at the GaInP etch-stop layer 48. The removal of the parent substrate 40 and graded layers 36 not only remove material that is not transparent to the shorter wavelength, sub-bandgap, light, but it leaves an ultra-thin cell 12, which has very little thickness for free charge carriers in the doped semiconductor material to absorb sub-bandgap light. Therefore, a very high percentage (approaching about 100 percent) of the sub-bandgap light incident on the cell 12 gets transmitted through the cell 12.

Figure 7:
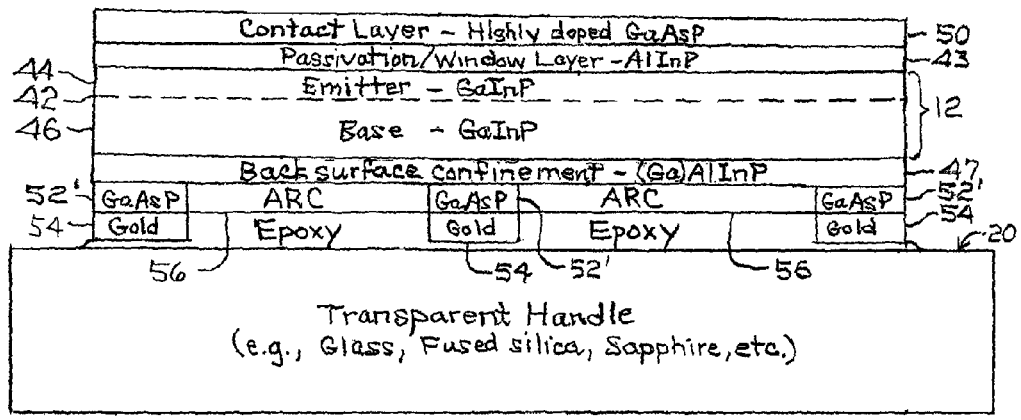
FIG. 7 is a diagrammatic illustration of another intermediate stage structure in the method of fabricating the photovoltaic converter in FIG. 1 through removal of the etch-stop layer.

After the parent substrate 40 and graded layers 36 are removed, as explained above, the GaInP etch-stop layer 48 is also removed, for example, but not for limitation, with hydrochloric acid. Removal of the etch-stop layer 48 leaves the highly doped GaAsP contact layer 50 exposed, as shown in FIG. 7.

Figure 8:
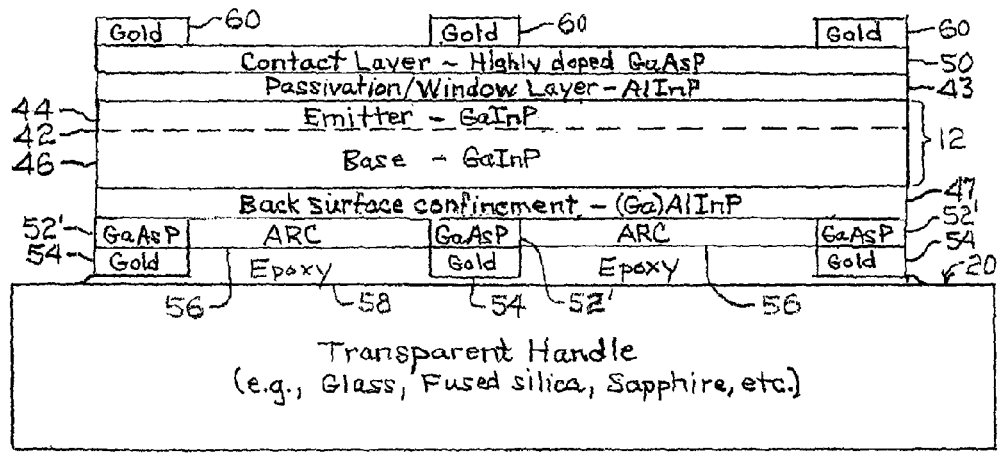
FIG. 8 is a diagrammatic illustration of another intermediate stage structure in the method of fabricating the photovoltaic converter in FIG. 1 through application of a metal grid contact on the front contact layer.

A metal (e.g., gold or the like) top or front contact grid 60 is then electro-plated to the exposed GaAsP contact layer 50, as shown in FIG. 8, although other methods of applying or depositing the grid 60 on the GaAsP contact layer 50 can also be used. If the process described above is done with a large area comprising enough material for multiple cells, an etch process can be employed at this point to isolate the material into a number of individual cells (not shown). Essentially, the individual cells are isolated from each other out of a large area photovoltaic converter structure by patterning a mesa mask (not shown) and etching through the GaInP active layers (emitter 44 and base 46) with standard etchants, as is known to persons skilled in the art.

Figure 9:
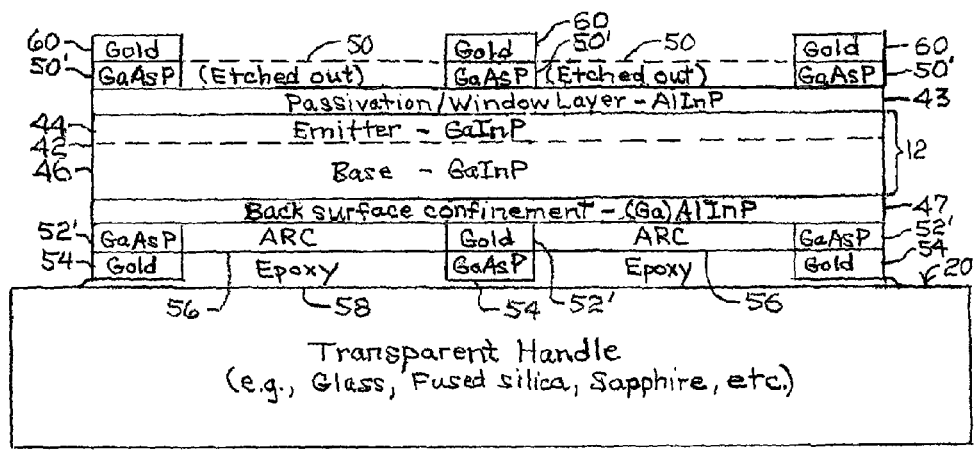
FIG. 9 is a diagrammatic illustration of another intermediate stage structure in the method of fabricating the photovoltaic converter in FIG. 1 though the removal of the front contact layer between the front grid lines.

Since the GaAsP front contact layer 50 absorbs some of the incident radiation R before it reaches the cell 12, it is etched out of the area between the gold grid lines 60, as shown in FIG. 9, leaving traces 50' of the highly doped GaAsP contact under the gold grid lines 60 and in contact with the passivation/window layer 43 for conducting electric current from the cell 12. This etching, like that for the GaAsP back contact layer 52, can be done with a mixture of ammonium hydroxide and hydrogen peroxide, as described above. Finally, a front anti-reflection coating (ARC) 62 is applied over the exposed passivation/window layer 43, as shown in FIG. 1 for minimizing reflection from the front surface of the emitter 44 and maximizing transmission of the incident solar radiation R into the cell 12, and another back anti-reflection coating 64 is deposited onto the exposed back surface 22 of the transparent handle 20.

The final structure, as shown in FIG. 1, has the emitter 44 and base 46 in the proper configuration with metal (e.g., gold or the like) grids 60, 54 on the front and back, respectively, and a transparent handle 20 secures the structure at its bottom or back surface. External contact to both the front and back contact grids 60, 54 can be made from the front of the converter device 10.

As mentioned above, this converter structure and method of fabrication can also be done with a GaInP cell grown on a Ge parent substrate, but the specific etchants used to remove the parent substrate are different.

While the example transparent, ultra-thin, single cell, high bandgap, lattice-mismatched photoelectric converter 10 described above is very high performance and very transparent to sub-bandgap light, there can be problems in embodiments that have very thin emitter layers. Often the emitter of a cell is very thin and heavily doped. When the cell 12 structure is grown inverted, i.e., the emitter 44 first and then the base 46, as described above, the emitter layer 44 may be subjected to a lengthy period of elevated temperature during the subsequent growth of the much thicker base 46. With the temperature high for such an extended period, the dopants may diffuse away from the emitter 44 and into the base 46, which can cause problems, including pushing the junction 42 deeper into the cell 12 than desired. Such a deep junction may, for example, reduce the blue response of the cell 12, because shorter wavelengths are absorbed near the front face of the cell.

Figure 11:
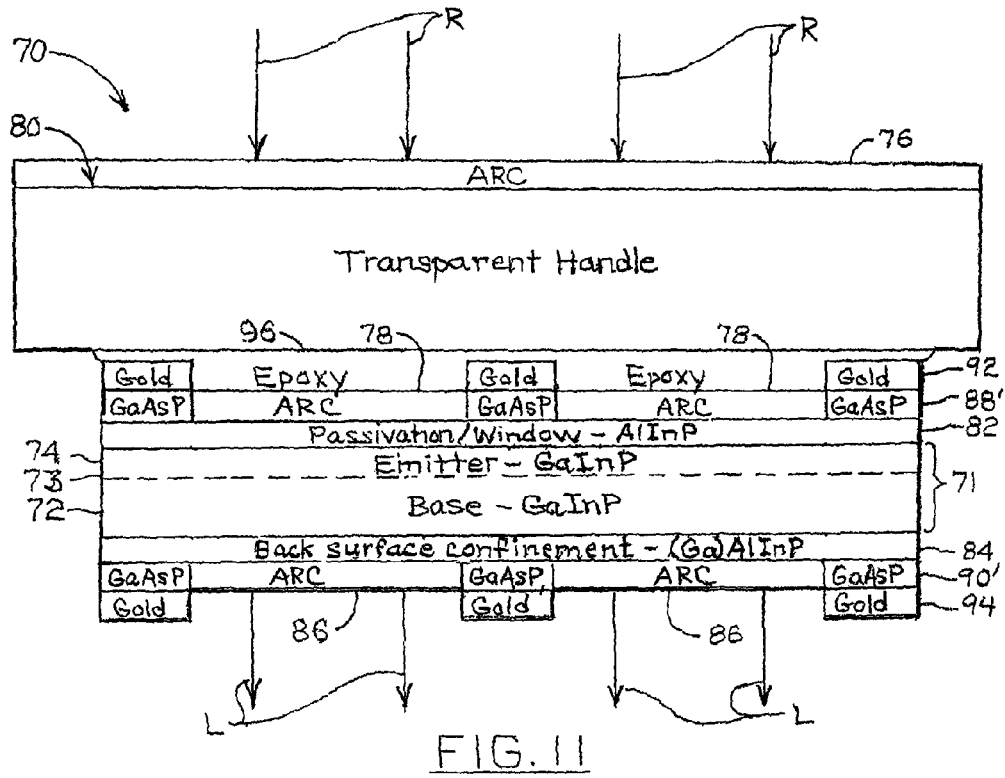
FIG. 11 is a diagrammatic illustration of a non-inverted, ultra-thin, transparent, high bandgap, group III-V, photovoltaic converter.

To address that problem, an alternate embodiment transparent, ultra-thin, single cell, high bandgap, lattice mismatched, photovoltaic converter 70 is illustrated diagrammatically in FIG. 11. This transparent photovoltaic converter 70 is similar to the example transparent photovoltaic converter 10 described above, but the cell 71 is grown upright, not inverted, so the base 72 is grown first, before the emitter 74.

Therefore, as shown in FIG. 11, the incident solar radiation R or other light is transmitted into the transparent handle 80 by the anti-reflection coating (ARC) 76. From the transparent handle 80, the light propagates through the cell anti-reflection coating (ARC) 78 and passivation/window layer 82 and into the cell 71, which absorbs the short wavelength portion of the solar radiation R with photon energy at least as high as the bandgap energy $E_g$ of the cell 71. The sub-bandgap radiation L emerges from the cell 12 and propagates through the back surface confinement layer 84 and back anti-reflection coating 86 to emerge from the converter device 80.

Figure 12:
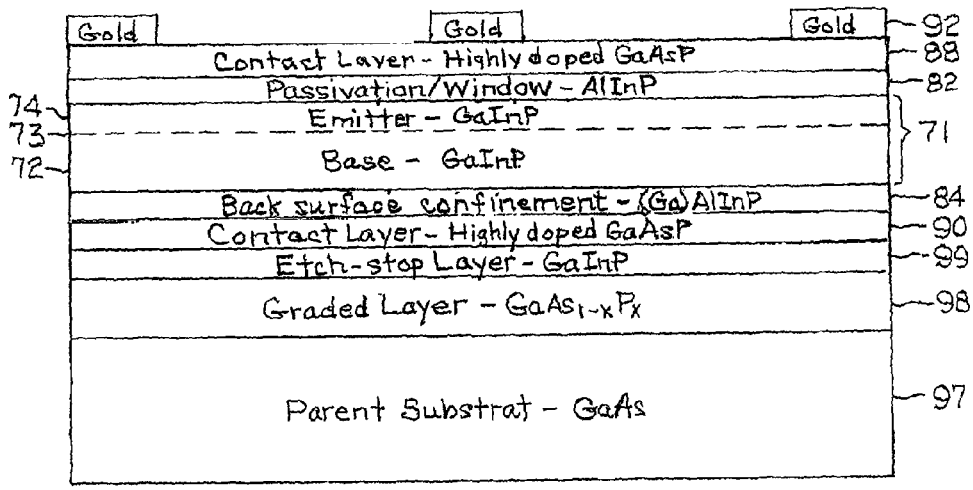
FIG. 12 is a diagrammatic illustration of a an early stage structure in a method of fabricating the photovoltaic converter in FIG. 11 through the epitaxial growth stage and the application of front metal grid contacts.

This example transparent, ultra-thin, photovoltaic converter 80 is made somewhat similar to the transparent, ultra-thin, photovoltaic converter 10 described above, but with several differences, including the growth of the base 72 before the emitter 74. As shown in FIG. 12, the device is grown on a GaAs parent substrate 97 with graded layers 98 of $GaAs_{1-x}P_x$, an etch-stop layer 98 of GaInP, a contact layer 90 of highly doped GaAsP, and a back surface confinement layer 84 of (Ga)AlInP in much the same manner as described above for the photovoltaic converter 10. Then the GaInP cell 71 is grown on the back surface confinement layer 84—GaInP base 72 first, followed by the GaInP emitter 74, both of which are doped as understood by persons skilled in the art to form the n/p or p/n junction 73 of the cell 71. An AlInP passivation/window layer 82 is then grown on the emitter 74, followed by the front contact layer 88 of highly doped GaAsP to complete the epitaxial growth stage of the fabrication.

Figure 13:
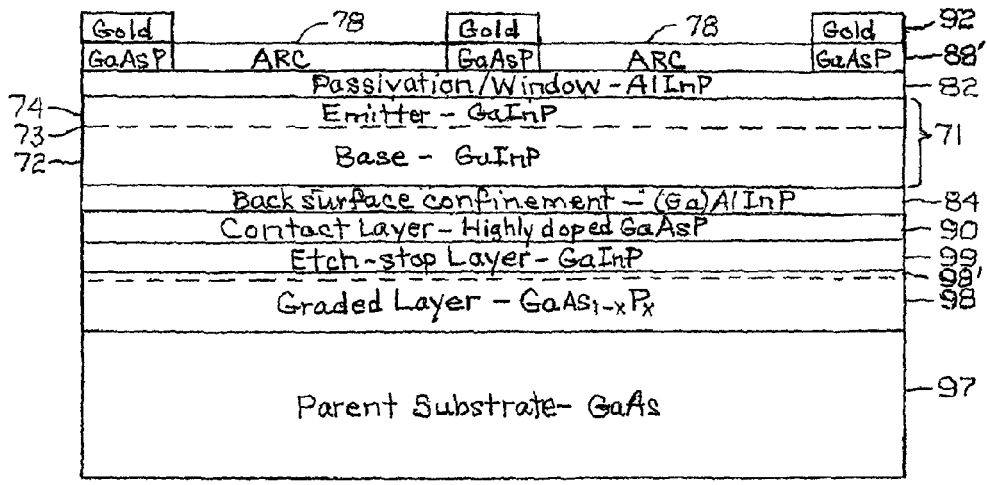
FIG. 13 is a diagrammatic illustration of an intermediate stage structure in the method of fabricating the photovoltaic converter in FIG. 11 through the removal of the front contact layer between the grid lines and the application of a front anti-reflection coating.

After the epitaxial growth stage of the fabrication is complete, a metal (e.g., gold or the like) grid 92 is placed on the GaAsP contact layer 88, e.g., by electro-plating or other process known to persons skilled in the art. Then the GaAsP contact layer 88 is etched away between the grid lines 92, as explained above for the photovoltaic converter 10, leaving only GaAsP contacts 88' between the passivation/window layer 82 and the gold contacts 92, as shown in FIG. 13. Finally, a anti-reflection coating 78 is deposited on the exposed AlInP passivation/window layer 82 to finish the active structure of the device 80, as shown in FIG. 13.

Figure 14:
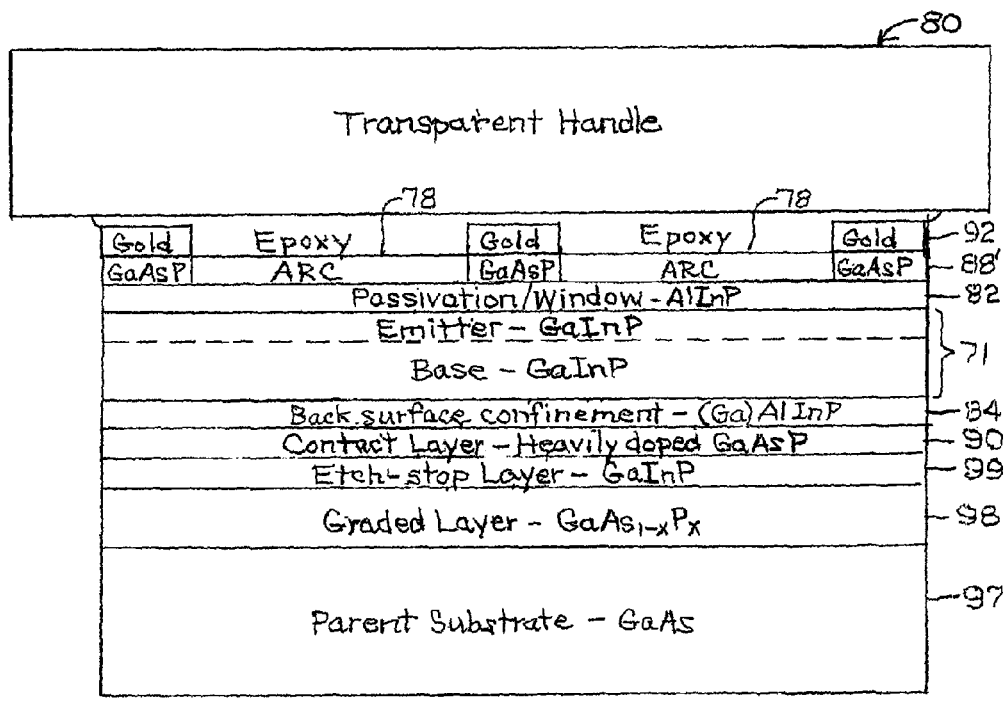
FIG. 14 is a diagrammatic illustration of an intermediate stage structure in the method of fabricating the photovoltaic converter in FIG. 11 through mounting the front of the structure to a transparent handle.

The top or front of the finished active structure shown in FIG. 13 is then mounted on a transparent handle 80, for example, with an epoxy 96, as shown in FIG. 14, whereas, in the fabrication of the photovoltaic converter 10 described above, the transparent handle 20 (FIG. 1) was mounted on the bottom or back of the cell structure. The GaAs parent substrate 80 and $GaAs_{1-x}P_x$ graded layers 98 are then etched away in much the same manner as described above for the photovoltaic converter 10, e.g., by wet chemical etching in a mixture of ammonium hydroxide and hydrogen peroxide. The etch-stop layer 99 is then removed with hydrochloric acid to expose the GaAsP contact layer 90. Finally, the bottom or back metal (e.g., gold or the like) contact grid 94 is electroplated onto the exposed GaAsP contact layer 90, the GaAsP between the grid lines 94 is etched away, leaving the GaAsP contacts 90' between the (Ga)AlInP back surface confinement layer 84 and the metal grid contact 94, and a back surface anti-reflection coating (ARC) 96 is applied on the exposed back surface confinement layer 84 to finish the photovoltaic converter device 80, as illustrated in FIG. 11. Individual photovoltaic converters 70 can be isolated from others (not shown) by etching, as described above for the photovoltaic converter 10.

Since the cell structure is grown upright with the thick GaInP base 72 grown first, before the much thinner GaInP emitter 74, the emitter 74 is not exposed to high growth temperature levels for nearly as long the process described above for the photovoltaic converter 10, and the resulting junction 73 is more shallow and robust, which is an advantage for more efficient solar energy to electric energy conversion. However, there is a trade-off. The entire spectrum of solar radiation S has to propagate through the transparent handle 80 and epoxy bonding agent 96 to reach the cell 71, as illustrated in FIG. 11. Therefore, while materials for the handle 80 and epoxy 96 are chosen to be as transparent as possible to the entire solar spectrum, for example, glass, fused silica, sapphire, etc., the handle 80 is thick compared to the ultra-thin cell 12, and some absorption of energy and attenuation of the incident light in that thickness, especially in the shorter wavelengths, is unavoidable.

Figure 15:
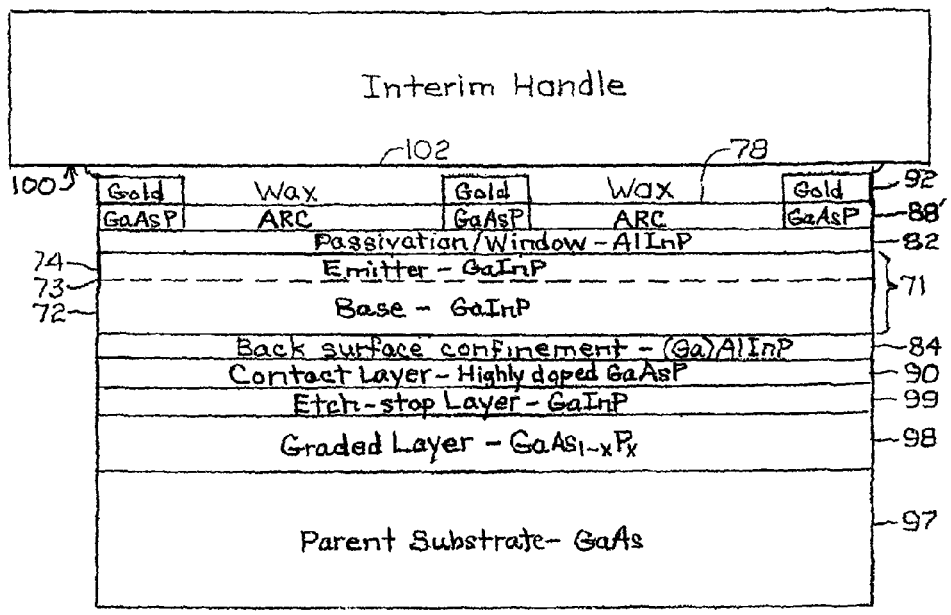
FIG. 15 is a diagrammatic illustration of an intermediate stage structure in the method of fabricating another example non-inverted, ultra-thin, transparent, high bandgap, group III-V, photovoltaic converter shown in FIG. 17 through mounting the front of a preliminary structure to an interim handle.

One way to mitigate this problem is to grow the cell 71 and accompanying layers upright in the same manner as described above for the photovoltaic converter embodiment 70, e.g., as shown in FIG. 13, but, rather than mounting the structure permanently on the transparent handle 80 as shown in FIG. 14, mounting it temporarily instead on an interim handle 100 with a temporary adhesive 102, as illustrated in FIG. 15. The temporary adhesive 102 can be, for example, a wax with a high melting temperature, and the temporary handle 100 can be any reasonably rigid material that maintains its structural integrity under processing temperatures used to finish the device. For example, glass may be used as an interim handle 100. After the device is temporarily adhered to the interim handle 100, the parent substrate 97, graded layers 98, and etch-stop layer 99 are removed, as described above for the previous examples. Then the metal (e.g., gold) back contact grid 94 is electroplated onto the GaAsP contact layer 90, which is subsequently etched away, and a back anti-reflection coating (ARC) 86 is applied, all in the same manner as also described above for the previous examples.

Figure 16:
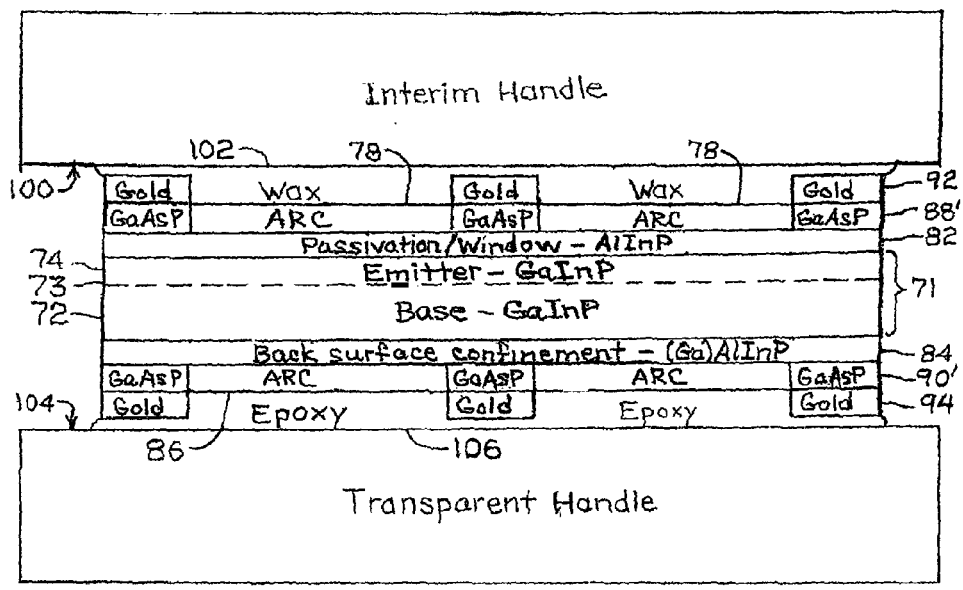
FIG. 16 is a diagrammatic illustration of another intermediate stage structure in the method of fabricating the photovoltaic converter shown in FIG. 17 through removal of the parent substrate and graded layer, application of a back metal grid, removal of the back contact layer between the grid lines, application of a back anti-reflection coating, and mounting the back of the structure on a transparent handle.
Figure 17:
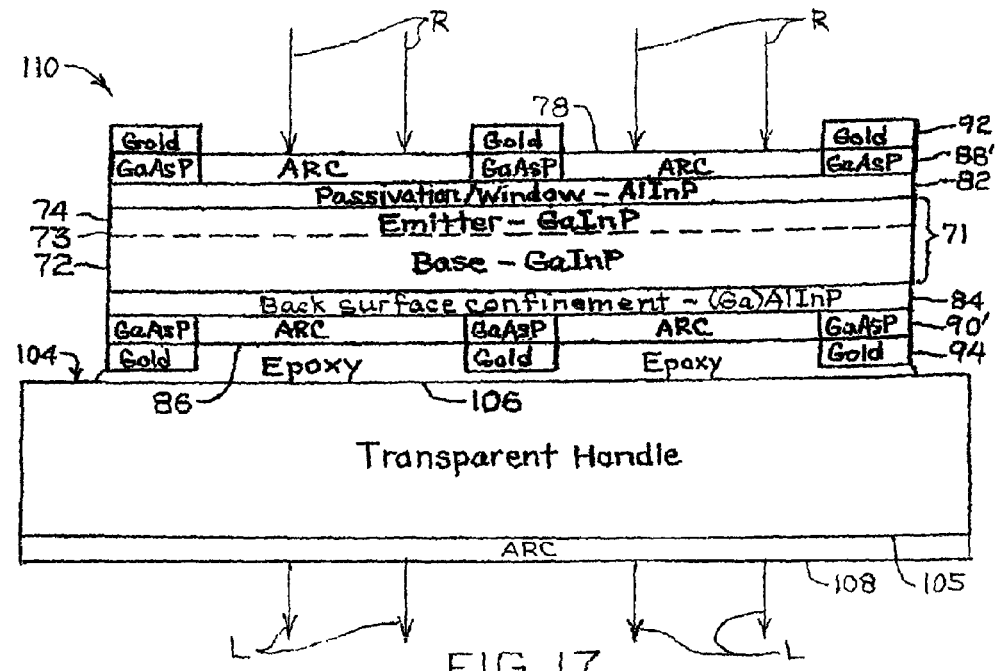
FIG. 17 is a diagrammatic illustration of another example non-inverted, ultra-thin, transparent, high bandgap, group III-V photovoltaic converter.

After the device is prepared on the interim handle 100 as explained above, the back surface of the device is permanently bonded to a transparent handle 104 with epoxy in a similar manner as shown in FIG. 16 and as explained above for the previous examples. Then, an anti-reflection coating (ARC) 108 is applied to back surface 105 of the permanent transparent handle 104, and the interim handle 100 is removed to finish with the transparent, ultra-thin, single cell, photovoltaic converter 110 shown in FIG. 17. Some care may have to be exercised to keep the temperature of the device low enough during the process of adding the metal contacts 94, ARC 108, and other operations, including the curing of the epoxy 106, so that the wax does not melt prematurely. When the time comes to remove the interim handle 100, the entire device structure can be soaked in an appropriate solvent, for example trichloroethylene or acetone, that dissolves the wax to separate the interim handle 100. The individual devices 110 can be isolated from others in a sheet (not shown) by etching from the top or front side. The resulting transparent photovoltaic converter 110 shown in FIG. 17 has some of the advantages of both the example embodiments 10 and 70 described above. The upright growth as opposed to inverted growth of the cell 71 eliminates the dopant diffusion problem with the inverted growth of the example photovoltaic converter 70, and the placement of the transparent handle 104 on the back of the cell 71, as in the FIG. 1 example 10, instead of in front of it, as in the FIG. 11 example 70, eliminates the attenuation problem.

The process of using an interim handle to hold the cell structure in tact while the parent substrate and graded layer are removed and replaced with a transparent permanent handle can also be used to make a transparent converter with a structure like the transparent photovoltaic converter 70 in FIG. 11. Essentially, the cell is grown inverted, i.e., emitter first and then base, on a GaAs parent substrate and graded layers, as described above for the photovoltaic converter example 10 and as shown in FIGS. 1-10, but with the exception that, instead of mounting a permanent transparent handle on the back side as in the FIG. 5 step, an interim handle may be mounted as shown in FIG. 15 on the back of the inverted cell and other components. Then the parent substrate and graded layers are removed from the front, the front contacts and the ARC are applied, and the permanent transparent handle may then be bonded permanently to the front of the cell. Finally, the interim handle is removed as explained for the example embodiment 110 above.

As mentioned above, a problem encountered in the example transparent, inverted, high bandgap, photovoltaic converter 10 illustrated in FIG. 1, wherein the emitter 44 is grown first, before growing the base 46, is that the sulfur dopant used to make the n-type GaInP emitter 44 diffuses during the growth of the base 46 into the GaInP base material, which effectively makes the emitter 44 or thicker and the junction 42 deeper than desired for efficient absorption and conversion of the shorter wavelength light, especially in the blue wavelength band. As an example, for a cell 12 doped in an n-on-p configuration, the emitter 44 is n-doped with sulfur, and the base 46 is p-doped with zinc. Because high energy, shorter wavelength, blue light is absorbed very close to the front surface of the cell 12, and lifetimes of minority carriers before recombination are limited, the emitter 44 is designed to be very thin, e.g., in a range of about 200 to 500 Å, to reduce the effects of recombination of minority carriers near the front surface of the cell 12 before they can reach the junction 42. The junction 42 depth, thus the emitter 44 thickness, is determined by the location at which the zinc concentration exceeds the sulfur concentration, and, if the dopants, e.g., sulfur and/or zinc in this example, diffuse appreciably, this location where the zinc concentration exceeds the sulfur concentration may be at a different depth in the cell 12 than was intended or wanted. In lattice-mismatched GaInP, as is grown for the cell 12, sulfur appears to be relatively mobile and diffuses quite easily through the crystal lattice of the GaInP material. For cells grown inverted, as is the cell 12 in this example, the problem of sulfur diffusion is exacerbated, because the very thin emitter 44 is grown first, followed by the much thicker base 46, e.g., about 2-3 µm, so the emitter 44 is subjected to the high growth temperature for a long period of time during which the sulfur tends to diffuse. By way of example and without intending to be limiting, a typical deposition method used for growing group III-V semiconductor materials epitaxially is metal organic chemical vapor deposition (MOCVD), in which the deposition temperature is in the range of about 600 to 750° C. In an example of an emitter 44 about 200 to 3000 Å thick and a base 46 about 2 µm thick, the emitter 44 may be grown for about thirty seconds, whereas the base 46 may be grown for about twenty minutes. An analysis of a doping profile with secondary ion mass spectroscopy (SIMS) for GaInP doped with sulfur in this manner found sulfur to extend almost 1,800 Å into the GaInP, thereby creating a very deep junction 42 and a thick emitter 44. The blue response of that solar cell, i.e., conversion of shorter wavelength energy to electric energy, was found to be correspondingly low.

To improve the short wavelength (e.g., blue) response in a high bandgap, lattice-mismatched cell that is grown inverted, i.e., emitter first followed by the base, in a photovoltaic converter device, a modified cell growth method may be used. For a description of this method, reference is made to the example high bandgap photovoltaic converter 10 shown in FIG. 1 and for which a fabrication process is illustrated in FIGS. 2-10, but with the understanding that this method is not restricted to that example and can be used in myriad other situations in which a shallow junction and a thin emitter is desired. This method includes utilizing an adjacent layer of semiconductor material, e.g., the GaAsP contact layer 50, as a staging reservoir for dopant atoms, which are then allowed to diffuse into the cell 12 material to form the junction 42 in the cell. The adjacent layer can then be removed or left in place. In this example, where the adjacent layer used as the staging reservoir is the GaAsP contact layer 50, it is removed for light absorption reasons and replaced with the ARC 62. The reservoir may also extend into the etch-stop layer 48, which will also be removed as explained above.

Figure 18:
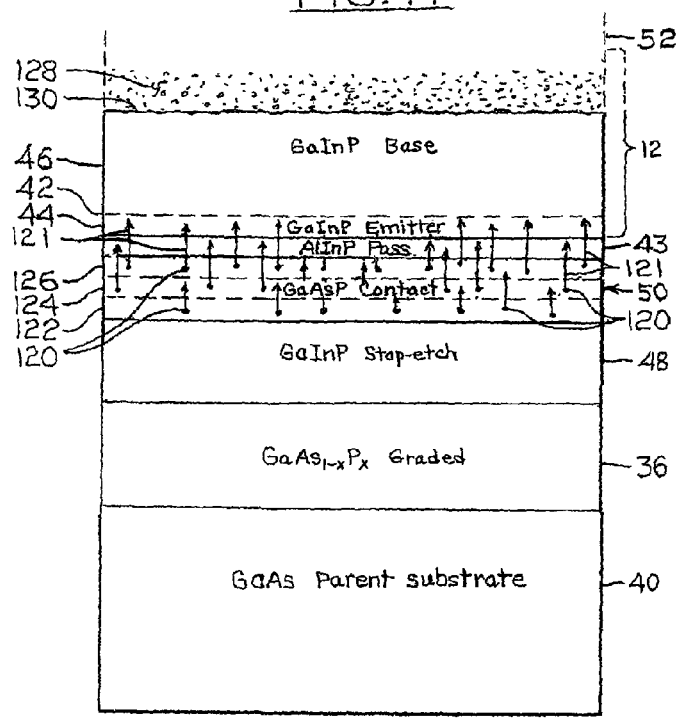
FIG. 18 is a diagrammatic illustration of the epitaxial growth phase of an inverted, high bandgap, photovoltaic converter structure during a method of forming a very shallow junction and very thin emitter for improved blue response, which can be used with all of the inverted examples described herein.

Referring for example, but not for limitation, to FIG. 18 in conjunction with FIGS. 1-10, the cell 12 and other layers that comprise the high bandgap, photovoltaic converter device 10 are grown epitaxially, for example, but not for limitation, in a MOCVD reactor, lattice-mismatched on a parent substrate 40 of GaAs, as described above. After the graded layers 36 and etch-stop layer 44 of GaInP are grown on the GaAs parent substrate 40, a layer 50 of highly doped GaAsP is grown as a front contact. Then, after a passivation/window layer 43 of AlInP is grown, the GaInP cell 12 is grown with doping impurities to provide a very thin emitter 44 first, followed by a much thicker base 46. For example, but not for limitation, the GaAsP contact layer 50 may be about 2,000 Å thick, the AlInP passivation/window layer 43 is very thin, e.g., about 100-500 Å thick, the emitter 44 may be GaInP, eventually doped with sulfur to be n-type about 200-3000 Å thick, and the base 46 may be GaInP about 2-4 µm (20,000-40,000 Å) doped with zinc be p-type, thereby forming the n/p homo-junction 42.

In this method, however, the emitter 44 portion of the GaInP cell 12 is not doped as it is being grown. Instead, some or all of the preceding GaAsP contact layer 50, and optionally the etch-stop layer 48, is doped with the dopant that is needed to form the emitter 44 portion of the GaInP cell 12 (for example, sulfur, selenium, etc., for n-type doping), as indicated by the dopant atoms 120 in FIG. 18. Then, an initial portion of the GaInP cell 12 is deposited with no doping, before the p-type doping is started for the base 46 portion of the cell 12. For example, if it is desired to have the emitter 44 portion of the cell 12 about 500 Å thick, the first 500 Å of the GaInP cell 12 is grown undoped, which may take, for example, about 30 seconds, as mentioned above. Then, the p-type dopant (for example, zinc, cadmium, etc.) for the base 46 is started and continued, as indicated by the vapor 128 depositing atoms in the growth plane 130 in FIG. 18, for the remainder of the GaInP growth of the cell 12 in the usual manner until the desired base 46 thickness (for example, about 2-3 µm) is achieved. As mentioned above, the growth of the base 46 portion of the GaInP cell 12 may take 20 to 30 minutes or longer at a fairly high temperature in a typical MOCVD reactor. During that time as the base 46 of the cell 12 is being grown, as indicated by the vapor 128 and growth plane 130, in that fairly high temperature range, the sulfur atoms 120, which were originally deposited in the GaAsP contact layer 50 as a staging reservoir, migrate and diffuse as indicated by the arrows 121 into the GaInP that was initially grown without a dopant, thereby doping the emitter 44 and forming the n/p junction 42 at a shallow depth during the time that the base 46 is being grown. The AlInP passivation/window layer 43 is very thin, as mentioned above, so it is not a barrier to the diffusion of the sulfur atoms 120 into the GaInP cell 12.

Depending on the particular circumstances and the desired depth of the junction 42 in the cell 12, it may also be advantageous to deposit the emitter dopant atoms 120, e.g., the sulfur, in only a portion of the thickness of the GaAsP contact layer 50. For example, if a very thin emitter 44 and shallow junction 42 are desired, the sulfur 120 may be deposited only in a first part 122 of the thickness of the GaAsP contact layer and leaving the remainder, e.g., portions 124, 126, of the thickness of the GaAsP contact layer 50 without any sulfur. Then, before the sulfur atoms from the first part 122 can reach and diffuse into the GaInP cell 12 material, they first have to migrate through the undoped portion, e.g., 124, 126, of the GaAsP contact layer 50 that is adjacent the GaInP cell 12 material. By the time the dopant atoms 120 from the first part 122 of the GaAsP contact layer 50 diffuse through the undoped other portion(s) 124, 126 and through the thin passivation/window layer 43 to reach the GaInP cell 12 material, most of the base 46 of the cell 12 will have been grown, and there will be only a short time remaining at the elevated MOCVD temperature for the dopant atoms 120 to actually diffuse into the GaInP cell 12 material before the growth of the base 46 and back contact layer 52 are completed and the MOCVD is stopped. Of course stopping the MOCVD allows the temperature to be decreased, which ends for practical purposes the diffusion of the dopant atoms 120 and sets the junction 42 at a very shallow depth with a very thin emitter 44 in the cell 12, which, as explained above, may provide better blue response than thicker emitters and deeper junctions.

On the other hand, if a slightly deeper junction 42 is desired, the dopant atoms 120 can be deposited in more of the GaAsP contact layer, for example in portions 122 and 124 so that the diffusing dopant atoms reach the GaInP cell 12 material quicker, thus having a longer time to diffuse farther into the cell 12. The spatial extent to which the sulfur actually diffuses depends on several factors, including: (1) The actual sulfur concentration in the GaAsP contact layer 50, because the driving physical force for diffusion is the existence of a gradient in concentration and the tendency of a physical system to reach equilibrium; (2) The growth temperature, which relates to the diffusion coefficient constant; and (3) The remaining growth time after the sulfur flow in MOCVD reactants is terminated, i.e., when the cool down occurs, and the steady state is approached asymptotically. In general, the spatial extent or reach of the dopant (e.g., sulfur or the like) diffusion, thus junction 42 depth into the cell 12, will increase with an increase in any of the three factors listed above. Furthermore, the sulfur diffusion may be influenced by the degree to which the layers beneath the GaAsP contact layer 50, i.e., the GaInP etch-stop layer 48 and even the graded layers 36 may or may not also be doped with the same dopant (e.g., sulfur in this example), for the reasons related to the factor (1). Therefore, it may be desirable to also dope the GaInP etch-stop layer 48 and graded layers 36 to inhibit net diffusion of the dopant atoms 120 from the GaAsP contact layer 50 into the GaInP etch-stop layer 48 and graded layers 36 and to drive them instead toward the GaInP cell 12 material. A series of experiments were conducted wherein the explicit doping of the GaAsP contact layer 50 with sulfur atoms 120 was terminated three-thirds, two-thirds, and one-third of the way through the layer 50, i.e., through only the first part or zone 122, through both the first and second parts or zones 122, 124, or through all of the first, second, and third parts or zones 122, 124, 126, as shown in FIG. 18, thereby allowing the dopant atoms 120 to diffuse different distances into the cell 12 GaInP material. The devices made for each case were evaluated by measuring quantum efficiency (QE), and it was found that the high-energy, blue response of the devices improved as the sulfur dopant was terminated earlier rather than later in the growth of the GaAsP contact layer 50, which indicates that the farther the dopant atoms 120 are staged from the cell 12 GaInP, the less far they will diffuse into the cell 12 GaInP material, and the shallower the junction 42 will be. Of course, the dopant atoms 120 cannot be staged so far away from the cell 12 material that they never get time to reach the cell 12 material, or a junction will never be formed. Persons skilled in the art can design and implement this method to advantage, once they understand the principles of the method as explained above.

The high performance, high bandgap, lattice-mismatched, photovoltaic converter examples 10, 70, and 110 described above are all made to be transparent to sub-bandgap light, but there are applications for non-transparent high performance, high bandgap photovoltaic converters, too. For example, but not for limitation, a split-spectrum solar collector system may include optical components that split the high energy, short wavelength light spectrally from the rest of the spectrum and direct it to a specific high bandgap photovoltaic converter. In such a system, no sub-bandgap light is expected to reach the specific high bandgap photovoltaic converter, so there is no need for it to be transparent to sub-bandgap light.

Figure 19:
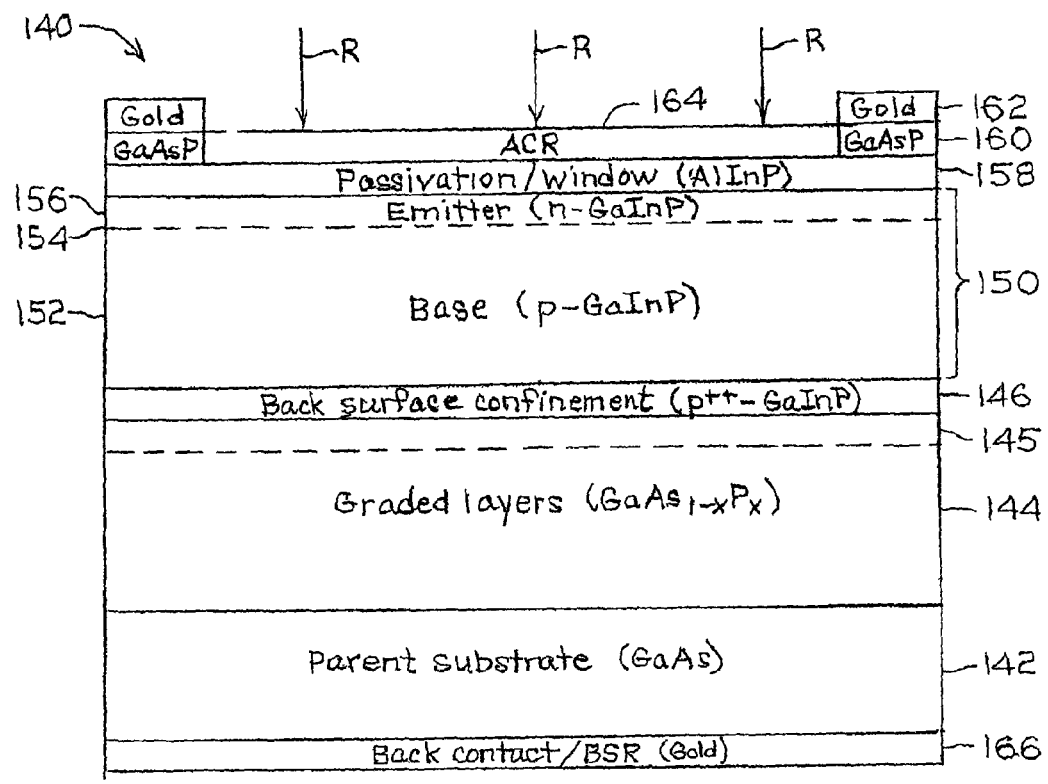
FIG. 19 is a diagrammatic illustration of an example non-inverted, non-transparent, high bandgap, group III-V, photovoltaic converter.

The example non-transparent, high performance, high bandgap, lattice-mismatched, photovoltaic converter 140 shown in FIG. 19 is particularly suitable for such a stand-alone use as a high bandgap solar cell in such a spectrally split solar collector system. Its basic structure is similar to the device grown for the transparent photovoltaic converter 70, as shown in FIG. 13, before it is mounted on a handle and the parent substrate and graded layers are removed, except that it does not need or have the etch-stop layer 99. Therefore, many of the features and descriptions for that photovoltaic converter 70 are applicable to this embodiment 140 and vice versa. Essentially, it is a photovoltaic converter with a high bandgap GaInP cell 150 that can be tailored for any bandgap between 1.9 eV and 2.2 eV by varying the ratio of Ga and In and without the need to add Al to get into these higher bandgaps. For purposes of discussion, an example 2.1 eV bandgap cell is discussed, but this photovoltaic converter 140, like those discussed above, is not limited to a 2.1 eV bandgap cell.

Development of a lattice-matched 2.1 eV solar cell has been attempted before by growing a quaternary alloy of AlGaInP on a GaAs substrate, but the performance of the cell was not excellent. Aluminum is a gettering element that causes the incorporation of oxygen into the material, and, while it may be used without problems in the thin window layers of most cells, as it is in this photovoltaic converter 140 and those example embodiments described above, it leads to a degradation of the bulk material quality in a thicker, base layer of a cell. Therefore, any advantages gained by growing the cell lattice-matched were apparently undone by the inclusion of aluminum in the alloy. Therefore, this high bandgap, 1.9-2.2 eV photovoltaic converter has a ternary GaInP cell with no aluminum and which is lattice-mismatched to the parent substrate.

As mentioned above, a 2.1 eV GaInP alloy has a relaxed lattice constant of 5.597 Å, which is approximately one percent smaller than the 5.653 Å lattice constant of the GaAs substrate 142. This misfit can be overcome by growing a series of step-graded layers of $GaAs_{1-x}P_x$, where the phosphorous content "x" of each successive layer is increased and the in-plane (i.e., growth plane) lattice constant is correspondingly reduced. Again, continuing gradual increase of "x" can also be done, but there are advantages to increasing in steps rather than smooth, continuous increase. Despite the tensile stress on the GaAsP graded layers, the material has been shown to be resilient to cracking. As explained above in relation to a previous example, a seven-step graded layer 144, each stepped layer being 2 μm thick, with the phosphorus content increased by approximately six percent per layer, has been grown so that the composition of the last layer in the grade (sometimes called the buffer layer 145) is approximately 43 percent phosphorus. Under these conditions, the GaInP active layers may be grown relaxed on the buffer layer 145 with a composition of $Ga_{0.65}In_{0.35}P$, which has a bandgap of about 2.1 eV. While the bulk quality of the active layers is lower than that of lattice-matched GaInP, the structure of the graded layers minimizes the density of threading dislocations that penetrate the active layers such that satisfactory bulk quality say be achieved.

The cell 150 is designed with a 3-4 μm thick base layer 152 and a thin emitter layer 156 about 200-3000 Å thick for good blue response, as discussed above. Both n/p and p/n configurations are possible, using sulfur, for example, as an n-type dopant and zinc, for example, as a p-type dopant. In the n/p configuration, a back surface confinement 146 can be achieved with a $p^+$ zinc dopant spike, while in the p/n configuration a thin layer of sulfur doped (Ga)AlInP may be required. Front surface passivation can be done with a thin layer of AlInP.

During the epitaxial growth stage, a highly doped GaAsP contact layer 160 is grown on the cell 150 after growing the passivation/window layer 158, as describe above for the other example embodiments, and, as also described above, a contact metal grid 162 (e.g. gold, but other metals will work) is electroplated or otherwise deposited on the GaAsP contact layer 160. Then, as also described above, the GaAsP layer 160 is removed by etching, and an anti-reflection coating 264 is applied to the front surface. A back contact 166, which can also serve as a back surface reflector (BSR), is also applied on the back surface of the GaAs substrate 142, which is doped to be a conductor of current from the cell 150 to the back contact 166.

This non-transparent photovoltaic converter 110 may be grown on a GaP substrate, since the substrate and graded layers do not need to be removed for transparency. The graded layers may still be a compositionally graded set of GaAsP layers, e.g., $GaAs_yP_{1-y}$, but in successively increasing, rather than decreasing, lattice constants. It is also possible for the growth of the cell to be on a silicon substrate or a silicon-germanium substrate, but thermal expansion differences can cause difficulties.

As mentioned above, the exact bandgap of the cell 150 is tunable in the range of approximately 1.9 to 2.2 eV. Depending on the choice of bandgap, the number of steps in the graded layer 144 may be adjusted, as well as the phosphorus content per layer. The bulk quality of the active layers may improve as the bandgap is decreased, as the overall mismatch is thereby lessened. Above approximately 2.2 eV, GaInP becomes an indirect bandgap semiconductor, which may need a significantly thicker cell to achieve comparable performance.

While a number of example aspects and implementations have been discussed above, those of skill in the art will recognize certain modifications, permutations, additions, and subcombinations thereof. It is therefore intended that the following appended claims and claims thereafter introduced are interpreted to include all such modifications, permutations, additions, and subcombinations as are within their true spirit and scope.

The words "comprise," 'comprises," "comprising," "composed," "composes,", "composing," "include," "including," and "includes" when used in this specification, including the claims, are intended to specify the presence of state features, integers, components, or steps, but they do not preclude the presence or addition of one or more other features, integers, components, steps, or groups thereof. Also the words "maximize" and "minimize" as used herein include increasing toward or approaching a maximum and reducing toward or approaching a minimum, respectively, even if not all the way to an absolute possible maximum or to an absolute possible minimum. In this description and the following claims, growing a layer or component on another layer or component may include either: (i) growing it directly on the other layer or component without any intervening layers or components; or (ii) growing it indirectly on the other layer or component after one or more intervening layers or components are grown.

The invention claimed is:

1. A method of fabricating a high bandgap GaInP photovoltaic converter, comprising:
    providing a crystalline growth structure having a growth surface that has a lattice constant which matches a relaxed lattice constant of a GaInP alloy that has a bandgap greater than that of $Ga_{0.51}In_{0.49}P$, wherein the crystalline growth structure comprises a graded GaAsP structure with a base surface having a lattice constant matching that of GaAs and where the growth surface comprises a $GaAs_{1-x}P_x$ alloy;
    growing a front contact layer on the growth surface;
    growing a GaInP photovoltaic cell on the front contact layer, the GaInP photovoltaic cell having a relaxed lattice constant matching the lattice constant of the growth surface; and
    growing a back contact layer on the GaInP photovoltaic cell.

2. The method of claim 1, wherein the front contact layer is a doped GaAsP front contact layer, the method further including:
    doping the GaAsP front contact layer as a n-type dopant for an emitter in the GaInP cell, growing an initial thickness of the GaInP cell with no dopant, and growing the remainder of the GaInP cell with a p-type dopant to form a base portion of the GaInP cell while allowing the n-type dopant diffuse from the GaAsP front contact layer into the undoped thickness of the GaInP cell to form an emitter portion of the GaInP cell.

3. The method of claim 2, including growing the GaInP cell in a process that involves an elevated temperature sufficiently high to induce the diffusion of the dopant from the GaAsP front contact layer into the GaInP cell.

4. The method of claim 3, wherein the elevated temperature is in a range of about 600-750° C.

5. The method of claim 2, including doping only a portion of the GaAsP front contact layer with the n-type dopant for the GaInP, said portion of the GaAsP being a spaced distance away from the base portion.

6. The method of claim 1, wherein providing the crystalline growth structure further comprises:
    growing a graded layer of $GaAs_{1-x}P_x$ on a crystalline parent substrate by starting the $GaAs_{1-x}P_x$ the graded layer with a value of "x" that proportions the As and P in the $GaAs_{1-x}P_x$ in a manner that provides the $GaAs_{1-x}P_x$ with a lattice constant that matches the lattice constant of the parent substrate and ends with a value of "x" that proportions the Ga and P in the $GaAs_{1-x}P_x$ in a manner that provides the $GaAs_{1-x}P_x$ with a growth plane lattice constant that matches a relaxed lattice constant of GaInP with a target bandgap between about 1.9 eV and 2.2 eV.

7. The method of claim 6, wherein the parent substrate is GaAs.

8. The method of claim 7, wherein the graded $GaAs_{1-x}P_x$ comprises 6 to 10 steps of $GaAs_{1-x}P_x$, each step being about 1.0 to 2.2 μm thick, with the phosphorus content increased, and the As content correspondingly decreased, by approximately 4 to 6 percent per step, and with the last step being approximately 30 to 44 percent phosphorus, 9. The method of claim 6, wherein the front contact layer is a doped GaAsP front contact layer and the back contact layer is a doped GaAsP back contact layer, the method further including:
    growing a front passivation/window layer between the doped GaAsP front contact layer and an emitter of the GaInP cell and growing a back side confinement layer between a base of the GaInP cell and the doped GaAsP back contact layer.

10. The method of claim 9, including affixing a metal front contact grid on the doped GaAsP front contact layer, removing the doped GaAsP front contact layer from openings between portions of the metal front contact grids, applying a front anti-reflection coating on the passivation/window layer, mounting the metal front contact grid on a transparent handle, removing the parent substrate and the graded layer, affixing a metal back contact grid on the doped GaAsP back contact layer, removing the doped GaAsP back contact layer between portions of the metal back contact grid, and applying a back anti-reflection coating on the back surface confinement layer.

11. The method of claim 10, wherein removing the parent substrate and the graded layer further comprises:
    growing an etch-stop layer between graded layer and the GaAsP back contact layer;
    removing the parent substrate and graded layer by etching them away with an etchant that is selective for the substrate and graded layer and does not react with the etch-stop layer; and then
    removing the etch-stop layer.

12. The method of claim 11, including growing the cell upright.

13. The method of claim 11, including growing the cell inverted.

14. The method of claim 9, including affixing a metal back contact grid on the doped GaAsP back contact layer, removing the doped GaAsP back contact layer from openings between portions of the back contact grid, applying a back anti-reflection coating on the back surface confinement layer, mounting the metal back contact grid metal back contact grid metal back contact grid on a transparent handle, and removing the parent substrate and graded layer.

15. The method of claim 14, wherein removing the parent substrate and graded layer further comprises:
    removing the parent substrate and graded layer by etching them away with an etchant that is selective for the parent substrate and graded layer and does not react with the etch-stop layer, and then removing the etch-stop layer.

16. The method of claim 15, including growing the cell upright.

17. The method of claim 15, including growing the cell inverted.

18. The method of claim 9, including affixing a metal front contact grid on the doped GaAsP front contact layer, removing the doped GaAsP front contact layer from openings between portions of the metal front contact grid, applying a front anti-reflection coating on the passivation/window layer, mounting the on an interim handle, removing the parent substrate and the graded layer, affixing a metal back contact grid on the doped GaAsP back contact layer, removing the doped GaAsP back contact layer from opening between portions of the metal back contact grid, applying a back anti-reflection coating on the back surface confinement layer, mounting the metal back contact grid on a permanent transparent handle, and removing the interim handle.

\* \* \* \* \*